(12) United States Patent
Kuniyasu et al.

(10) Patent No.: US 10,754,189 B2
(45) Date of Patent: Aug. 25, 2020

(54) BACKLIGHT FILM

(71) Applicant: FUJIFILM Corporation, Tokyo (JP)

(72) Inventors: Satoshi Kuniyasu, Kanagawa (JP); Tatsuya Oba, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/243,430

(22) Filed: Jan. 9, 2019

(65) Prior Publication Data

US 2019/0146274 A1 May 16, 2019

Related U.S. Application Data

(63) Continuation of application No. PCT/JP2017/023913, filed on Jun. 29, 2017.

(30) Foreign Application Priority Data

Jul. 11, 2016 (JP) .................... 2016-136889

(51) Int. Cl.
*G02F 1/13357* (2006.01)
*H01L 33/60* (2010.01)
(Continued)

(52) U.S. Cl.
CPC ...... *G02F 1/133602* (2013.01); *H01L 33/507* (2013.01); *H01L 33/60* (2013.01);
(Continued)

(58) Field of Classification Search
CPC .. G02F 2001/133614; F21K 9/62; F21K 9/64; F21V 9/30; F21V 9/32; F21V 13/08
See application file for complete search history.

(56) References Cited

U.S. PATENT DOCUMENTS 7,210,780 B1 5/2007 Bourdoncle et al.
8,770,800 B1 * 7/2014 Yriberri ................ F21V 7/0025
362/302
(Continued)

FOREIGN PATENT DOCUMENTS

CN 101331421 A 12/2008
JP 2002-055332 A 2/2002
(Continued)

OTHER PUBLICATIONS

International Search Report issued in PCT/JP2017/023913 dated Aug. 15, 2017.
(Continued)

*Primary Examiner* — Alexander K Garlen
*Assistant Examiner* — Colin J Cattanach
(74) *Attorney, Agent, or Firm* — Edwards Neils LLC; Jean C. Edwards, Esq.

(57) ABSTRACT

An object of the present invention is to provide a backlight film that uses a wavelength conversion film used for a liquid crystal display or the like, has satisfactory durability, and is able to emit light without color unevenness. The object is achieved by including a wavelength conversion film having a wavelength conversion layer and a gas barrier film that sandwich the wavelength conversion layer; and at least one reflective layer provided on one main surface of the wavelength conversion film and causing a film thickness distribution of the reflective layer to be ±5% or less.

7 Claims, 2 Drawing Sheets

(51) Int. Cl.
*H01L 33/50* (2010.01)
*F21K 9/62* (2016.01)
*F21V 9/30* (2018.01)
*F21V 9/32* (2018.01)
*F21K 9/64* (2016.01)
*F21V 13/08* (2006.01)
*G02F 1/1335* (2006.01)

(52) U.S. Cl.
CPC .................. *F21K 9/62* (2016.08);
*F21K 9/64* (2016.08); *F21V 9/30* (2018.02);
*F21V 9/32* (2018.02); *F21V 13/08* (2013.01);
*G02F 1/1335* (2013.01); *G02F 1/133603*
(2013.01); *G02F 1/133605* (2013.01); *G02F*
*2001/133614* (2013.01); *G02F 2201/50*
(2013.01); *G02F 2201/501* (2013.01)

(56) References Cited

U.S. PATENT DOCUMENTS

| | | | |
|---|---|---|---|
| 9,939,680 B2 * | 4/2018 | Cho | G02B 5/0257 |
| 2007/0086211 A1 * | 4/2007 | Beeson | G02F 1/133603 362/628 |
| 2010/0124064 A1 * | 5/2010 | Ogawa | F21S 8/04 362/307 |
| 2010/0246160 A1 * | 9/2010 | Ito | G02F 1/133603 362/84 |
| 2010/0254115 A1 * | 10/2010 | Wegh | F21S 10/02 362/84 |
| 2010/0328926 A1 * | 12/2010 | Hoelen | C09K 11/7774 362/84 |
| 2011/0044026 A1 * | 2/2011 | Deeben | H01L 33/508 362/84 |
| 2012/0002396 A1 * | 1/2012 | Tseng | F21V 7/22 362/84 |
| 2012/0218752 A1 * | 8/2012 | Sumitani | F21V 11/14 362/235 |
| 2013/0050588 A1 * | 2/2013 | Kamada | G02F 1/133603 348/739 |
| 2014/0160765 A1 * | 6/2014 | Sato | F21V 9/06 362/307 |
| 2015/0021634 A1 * | 1/2015 | Ishihara | H01L 25/0753 257/88 |
| 2015/0043198 A1 * | 2/2015 | Hwang | G02B 27/2221 362/97.4 |
| 2015/0198304 A1 * | 7/2015 | Ohkawa | G02F 1/133606 362/97.1 |
| 2015/0219936 A1 * | 8/2015 | Kim | G02F 1/133602 362/97.1 |
| 2016/0209553 A1 * | 7/2016 | Lee | G02F 1/133603 |
| 2017/0167697 A1 * | 6/2017 | Stevenson | F21K 9/64 |
| 2017/0242179 A1 | 8/2017 | Satake et al. | |
| 2017/0248809 A1 | 8/2017 | Oba et al. | |
| 2018/0341151 A1 * | 11/2018 | Kurita | G02F 1/133603 |

FOREIGN PATENT DOCUMENTS

| | | |
|---|---|---|
| JP | 2010-232252 A | 10/2010 |
| JP | 2011-040313 A | 2/2011 |
| JP | 2012-174634 A | 9/2012 |
| JP | 2015-156464 A | 8/2015 |
| JP | 2016-095426 A | 5/2016 |
| JP | 2016-103461 A | 6/2016 |

OTHER PUBLICATIONS

Written Opinion issued in PCT/JP2017/023913 dated Aug. 15, 2017.
International Preliminary Report on Patentability completed by WIPO dated Jan. 15, 2019 in connection with International Patent Application No. PCT/JP2017/023913.
Office Action, issued by the Japanese Patent Office dated Jun. 11, 2019, in connection with Japanese Patent Application No. 2016-136889.
Office Action, issued by the Korean Intellectual Property Office dated Jan. 17, 2020, in connection with Korean Patent Application No. 10-2019-7000035.
Office Action, issued by the Japanese Patent Office dated Oct. 29, 2019, in connection with Japanese Patent Application No. 2016-136889.
Office Action, issued by the State Intellectual Property Office dated Apr. 20, 2020, in connection with Chinese Patent Application No. 201780043104.2.

* cited by examiner

BACKLIGHT FILM

CROSS-REFERENCE TO RELATED APPLICATIONS

This application is a Continuation of PCT International Application No. PCT/JP2017/023913 filed on Jun. 29, 2017, which was published under PCT Article 21(2) in Japanese, and claims priority under 35 U.S.C. § 119(a) to Japanese Patent Application No. 2016-136889 filed on Jul. 11, 2016. The above applications are hereby expressly incorporated by reference, in their entirety, into the present application.

BACKGROUND OF THE INVENTION

1. Field of the Invention

The present invention relates to a backlight film used in a backlight unit of a liquid crystal display device or the like.

2. Description of the Related Art

A liquid crystal display device expands applications thereof as an image display device that has low power consumption and saves spaces. In the recent liquid crystal display device, as the improvement in properties of a liquid crystal display device, further power saving, the improvement in color reproducibility, and the like are required.

Along with power saving of a backlight of a liquid crystal display device, it is known to use a wavelength conversion film in a backlight unit for converting the wavelength of incidence rays in order to increase light utilization efficiency and to improve color reproducibility. As the wavelength conversion film, a wavelength conversion film formed of a quantum dot is known.

For example, the wavelength conversion film formed of the quantum dot has a configuration of sandwiching a quantum dot layer in which quantum dots are dispersed in a matrix including a resin with a support such as a resin film.

Quantum dots are crystals in the state of electrons in which the movement direction is restricted in all three dimensions, and in a case where nanoparticles of a semiconductor are three-dimensionally surrounded by a high potential barrier, the nanoparticles are quantum dots. The quantum dot exhibits various quantum effects. For example, the quantum dot exhibits a "quantum size effect" in which a state density (energy level) of electrons is discrete. According to this quantum size effect, an absorption wavelength and/or an emitting wavelength of light may be controlled by changing the size of quantum dots.

For example, JP2015-156464A discloses a lighting device (light emitting device) used for a direct-type backlight unit or the like including light sources, a light diffusing member that covers a plurality of light sources in common, and wavelength conversion films (wavelength conversion members) that are disposed in regions corresponding to respective light sources and that use quantum dots converting first wavelength light from the light sources to second wavelength light, and the like.

SUMMARY OF THE INVENTION

In the backlight unit or the like formed of the wavelength conversion film, as the light source, a light emitting diode (LED) is used in many cases. JP2015-156464A discloses that a blue LED is used as a light source.

In order to effectively using a wavelength conversion film, all of the light emitted by an LED which is a light source is preferably incident on a wavelength conversion film.

As well known, light emitted by an LED is diffused light. Therefore, in order to cause all of the light emitted by the LED to be incident on the wavelength conversion film, it is required to dispose the LED and the wavelength conversion film to be near to each other by considering a size of the wavelength conversion film, a spread angle (divergence angle) of the light emitted by the LED.

In a case where the LED and the wavelength conversion film are disposed to be near to each other, brightness of the light incident on the wavelength conversion film increases. In a case where the brightness of the light incident on the wavelength conversion film increases, the temperature increase of the wavelength conversion film due to the incident light increases.

However, according to the review of the present inventors, in a case where the LED and the wavelength conversion film are disposed to be near to each other, due to the light and the heat, the resin or the quantum dot that forms the quantum dot layer deteriorates (light deterioration and heat deterioration) such that the quantum dot layer deteriorates. Therefore, in a case where the LED and the wavelength conversion film are disposed to be near to each other, there is a problem in that the durability of the wavelength conversion film becomes insufficient.

Even in a case where the LED and the wavelength conversion film are not near to each other, according to the output of the LED, the brightness of light incident on the wavelength conversion film, and the material for forming the quantum dot layer, the quantum dot layer deteriorates in the same manner, and thus the durability of the wavelength conversion film becomes insufficient.

The object of the present invention is to solve the problem and is to provide a backlight film in which the deterioration of the wavelength conversion film due to light and heat from the light source can be prevented, the durability is high, the life span is long, and the light without color unevenness in the backlight unit can be emitted.

In order to achieve the above objects, there is provided the backlight film of the present invention including a wavelength conversion film having a wavelength conversion layer and a gas barrier film sandwiching the wavelength conversion layer; and at least one reflective layer provided on one main surface of the wavelength conversion film, in which a film thickness distribution of the reflective layer is ±5% or less.

It is preferable that the backlight film of the present invention further includes: a support that supports the wavelength conversion film, in which the plurality of the wavelength conversion films are spaced from each other in a plane direction of the support, and at least one reflective layer is provided for each of the wavelength conversion films.

It is preferable that a thickness of the reflective layer is 10 µm or more.

It is preferable that a size of the wavelength conversion film is 1,000 mm$^2$ or less.

It is preferable that the reflective layer reflects light at a wavelength range of 420 to 490 nm by 50% to 90%.

It is preferable that an area of the reflective layer is 1% to 30% with respect to an area of the wavelength conversion film.

According to the present invention, with respect to the backlight film used in the backlight unit of the liquid crystal display device or the like, it is possible to provide a backlight film in which the deterioration of the wavelength conversion layer due to light and heat from the light source can be prevented, the durability is high, the life span is long, and the light without color unevenness in a case of being used in the backlight unit of the liquid crystal display device or the like can be emitted.

DESCRIPTION OF THE PREFERRED EMBODIMENTS

Hereinafter, a backlight film of the embodiment of the present invention is specifically described based on suitable examples illustrated in the accompanying drawings.

The following description of constituent elements may be made based on a representative embodiment of the present invention, but the present invention is not limited to the embodiment.

According to the present specification, the numerical range expressed by using "to" means a range including numerical values described before and after "to" as a lower limit value and an upper limit value.

In the present specification, the expression "(meth)acrylate" means at least any one or both of acrylate and methacrylate. The same is applied to "(meth)acryloyl" and the like.

Figure 1:
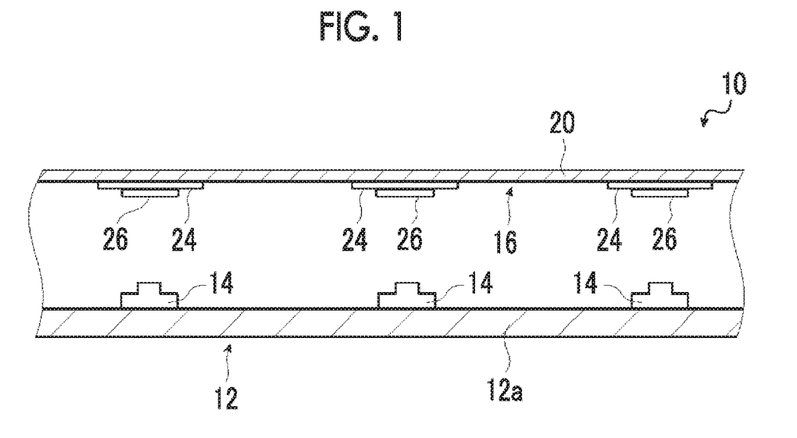
FIG. 1 is a diagram conceptually illustrating an example of a planar lighting device formed of an example of a backlight film of the present invention.

An exemplary planar lighting device 10 formed of an exemplary backlight film of the embodiment of the present invention is conceptually illustrated in FIG. 1.

The planar lighting device 10 is a direct-type planar lighting device used in the backlight unit of the liquid crystal display device or the like and has a housing 12 having a bottom plate 12a, a light source 14 disposed on the bottom plate 12a of the housing 12, and a backlight film 16 of the embodiment of the present invention.

In the following description, the "liquid crystal display device" may be referred to as an "LCD". The expression "LCD" is an abbreviation of a liquid crystal display.

FIG. 1 is a merely a schematic view, and the planar lighting device 10, for example, may have various well-known members provided in well-known lighting devices used for a backlight unit of an LCD or the like such as one or more of an LED substrate, a wiring, and heat dissipation mechanism, in addition to the members illustrated in the drawing.

The planar lighting device 10 is used in a backlight unit of an LCD or the like. Therefore, in a general form of use, various well-known members included in well-known backlight units such as a light diffusion plate and two prism sheets disposed at right angles to a ridge line are disposed on the upper side of the planar lighting device 10 in the drawing, and a liquid crystal panel and the like having a polarizer, a liquid crystal cell, and the like are disposed thereon.

Figure 4:
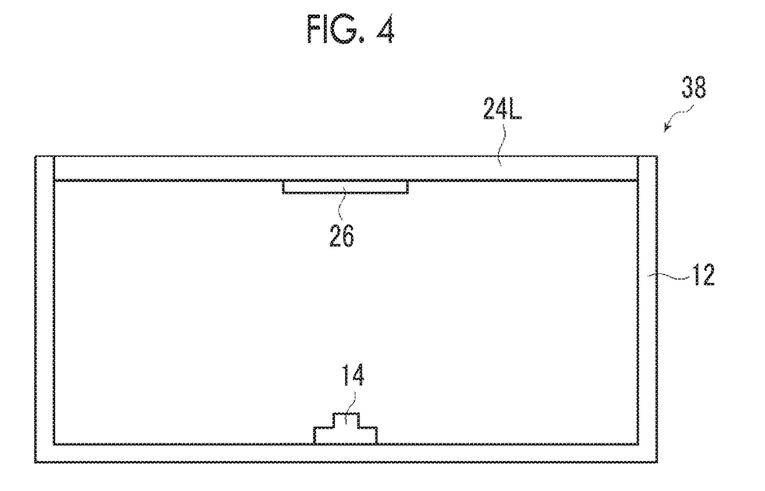
FIG. 4 is a diagram conceptually illustrating an example of a planar lighting device that uses another example of the backlight film of the present invention.
Figure 5:
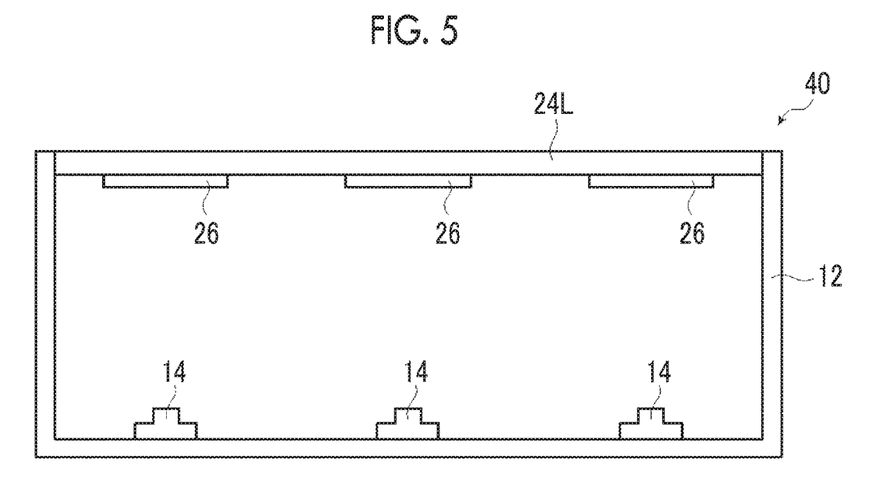
FIG. 5 is a diagram conceptually illustrating an example of a planar lighting device that uses another example of the backlight film of the present invention.

For example, the housing 12 is a rectangular housing in which a maximum surface is open, and the backlight film 16 of the embodiment of the present invention is disposed so as to close the open surface (see FIGS. 4 and 5). The light source 14 is disposed on the upper surface of the bottom plate 12a of the housing 12, that is, the bottom surface of the housing 12.

The housing 12 is a well-known housing that is used in the planar lighting device that forms a backlight unit of an LCD or the like.

As a preferred embodiment, with respect to the housing 12, at least the bottom surface that is the installation surface of the light source 14 is a light reflecting surface selected from a mirror surface, a metal reflecting surface, a diffuse reflecting surface, and the like. It is preferable that the entire inner surface of the housing 12 is a light reflecting surface.

Figure 2:
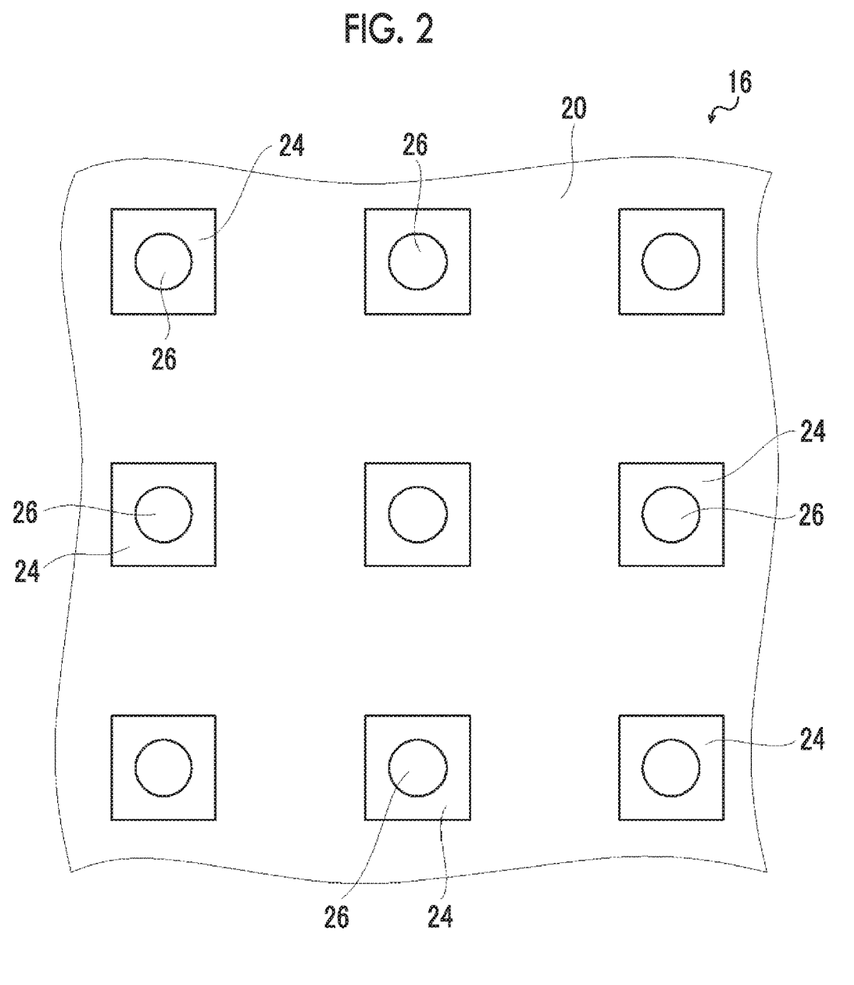
FIG. 2 is a plan view conceptually illustrating the backlight film illustrated in FIG. 1.

A plan view of the backlight film 16 is illustrated in FIG. 2. FIG. 2 is a diagram of the backlight film 16 illustrated in FIG. 1 seen from a lower side of FIG. 1.

The backlight film 16 is formed to have a support 20, a wavelength conversion film 24, and a reflective layer 26.

The support 20 supports the wavelength conversion film 24.

As the support 20, various kinds of sheet-like materials (film-like material, plate-like material) can be used, as long as the wavelength conversion film 24 can be supported, and the light emitted by the wavelength conversion film 24 with the light incident from the light source 14 and the light emitted by the light source 14 can be transmitted.

Specifically, examples of the support 20 include a resin film including one or more resin materials selected from white polyethylene terephthalate (PET), PET, polyethylene naphthalate (PEN), triacetyl cellulose (TAC), polycarbonate (PC), and nylon, and a glass plate.

The thickness of the support 20 may be appropriately set to be a thickness for maintaining a flat shape and supporting the wavelength conversion film 24 and the reflective layer 26 according to the size of the planar lighting device 10, a material of forming the support 20, and an optical functional layer (diffusion layer, anti-Newton ring layer, and the like).

Any shape can be used for the support 20 according to the design and the application of the planar lighting device 10.

The backlight film 16 in the illustrated example has the support 20 that supports the wavelength conversion film 24 and is spaced in the plane direction of the support 20, and a plurality of the wavelength conversion films 24 are provided on one main surface of the support 20. The reflective layer 26 is provided on each of the wavelength conversion films 24. In the illustrated example, one reflective layer 26 is provided on one sheet of the wavelength conversion film 24.

According to the present invention, particularly in a case where there is no description, the "plane direction" refers to a plane direction of the support 20. According to the present invention, the main surface refers to a maximum surface of a sheet-like material. In this case, the sheet-like material also includes a laminate.

In the planar lighting device 10, one light source 14 is provided on one wavelength conversion film 24.

With respect to the backlight film 16 of the illustrated example, as a preferable aspect, not by causing the entire surface to be a wavelength conversion film but by two dimensionally disposing the small wavelength conversion films 24 to be spaced from each other on the support 20, the amount of use of the wavelength conversion films 24

(quantum dot films (quantum dot (QD) films) is reduced, and the cost is reduced. This point will be described in detail below.

In the backlight film 16 of the illustrated example, the wavelength conversion films 24 are two dimensionally disposed on one main surface of the support 20 in a square grid shape.

According to the present invention, the disposition of the wavelength conversion films 24 supported by the support 20 is not limited to the square grid shape of the illustrated example. For example, the wavelength conversion film 24 may be two dimensionally disposed in any one of a staggered lattice form, an oblique lattice form, or a hexagonal lattice form.

In any case, it is preferable that the wavelength conversion film 24 are regularly disposed at regular intervals in that the brightness of the light emitted from the backlight film 16 can be easily caused to be uniform on the entire surface, and the like, A method of supporting the wavelength conversion film 24 by the support 20 is not particularly limited, and various well-known methods of supporting a sheet-like material can be used.

For example, the wavelength conversion film 24 may be bonded to the support 20 by bonding means which is any one of an optical transparent adhesive (optical clear adhesive (OCA)), an optical transparent tape, and an optically transparent double-sided tape. The wavelength conversion film 24 may be maintained by the support 20 with a transparent holding device or the like.

The wavelength conversion film 24 is a well-known wavelength conversion film to which receives the light emitted by the light source 14 is incident, in which the wavelength conversion is performed, and in which emission is performed.

Figure 3:
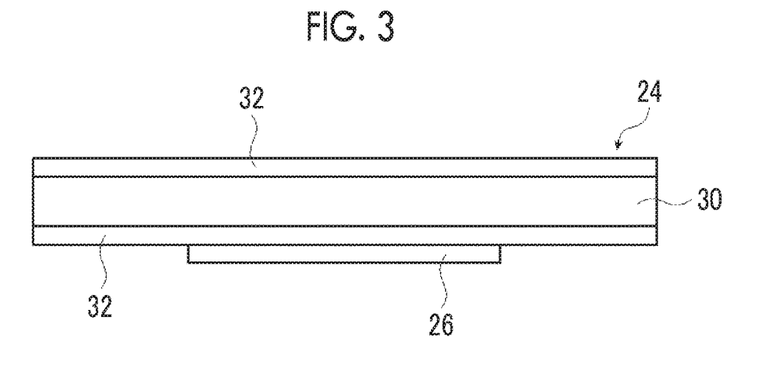
FIG. 3 is a conceptual view for describing the backlight film illustrated in FIG. 1.

A configuration of the wavelength conversion film 24 is conceptually illustrated in FIG. 3. FIG. 3 is a diagram of the wavelength conversion film 24 seen from the same direction as in FIG. 1. As illustrated in FIG. 3, the wavelength conversion film 24 has a wavelength conversion layer 30 and a gas barrier film 32 that sandwiches and supports the wavelength conversion layer 30.

For example, the wavelength conversion layer 30 is a fluorescent layer obtained by dispersing a large number of phosphors in a matrix of a resin or the like and has a function of converting the wavelength of light incident on the wavelength conversion layer 30 and emitting the light.

For example, in a case where the blue light emitted by the light source 14 is incident on the wavelength conversion layer 30, the wavelength conversion layer 30 converts the wavelength of at least a part of the blue light so as to be red light or green light by the effect of the phosphor contained inside and emits the light.

Here, the blue light is light having a center wavelength in a wavelength range of 400 to 500 nm, the green light is light having a center wavelength in a wavelength range of more than 500 nm and 600 nm or less, and the red light is light having a center wavelength in a wavelength range of more than 600 nm and 680 nm or less.

The function of the wavelength conversion exhibited by the fluorescent layer is not limited to the configuration in which the wavelength of the blue light is converted to be the red light or the green light, and may be a configuration in which at least a part of the incidence rays is converted into light having a different wavelength.

The phosphor is excited by at least incident excitation light and emits fluorescence.

The types of kind of the phosphor contained in the fluorescent layer are not limited, and various well-known phosphors may be suitably selected according to the properties of the required wavelength conversion or the like.

Examples of such phosphors include a phosphor obtained by doping a rare earth ion to phosphoric acid salt, aluminic acid salt, metal oxides, and the like, a phosphor obtained by doping an activating ion to a semiconducting substance such as metal sulfide, metal nitride, and the like, and a phosphor with a quantum confinement effect known as quantum dots, and the like, in addition to an organic fluorescent dye and an organic fluorescent pigment. Among these, quantum dots which can realize a light source having a narrow emission spectrum width and excellent color reproducibility in a case of being used for a display and which has excellent light emission quantum efficiency are suitably used in the present invention.

That is, according to the present invention, as the wavelength conversion layer 30, a quantum dot layer obtained by dispersing a quantum dot in a matrix of a resin or the like. In the wavelength conversion film 24, the wavelength conversion layer 30 as a preferable aspect is a quantum dot layer.

With respect to the quantum dot, for example, paragraphs 0060 to 0066 of JP2012-169271A may be referred to, but the present invention is not limited to these. As the quantum dot, commercially available products can be used without any limitation. The emission wavelength of the quantum dot may be generally adjusted by the composition and the size of the particle.

It is preferable that the quantum dot is uniformly dispersed in the matrix, but the quantum dot may be dispersed with bias in the matrix. The quantum dot may be used singly or two or more kinds thereof may be used in combination.

In a case where two or more quantum dots are used together, two or more kinds of quantum dots having different wavelengths of the emitted light may be used.

Specifically, examples of the well-known quantum dots include a quantum dot (A) having a light emission center wavelength in a wavelength range of more than 600 nm and 680 nm or less, a quantum dot (B) having a light emission center wavelength in a wavelength range of more than 500 nm and 600 nm or less, and a quantum dot (C) having a light emission center wavelength in a wavelength range of 400 to 500 nm. The quantum dot (A) emits red light excited by excitation light, the quantum dot (B) emits green light excited by excitation light, and the quantum dot (C) emits blue light excited by excitation light.

For example, in a case where the blue light is caused to be incident on the quantum dot layer including the quantum dot (A) and the quantum dot (B) as the excitation light, white light may be realized by the red light emitted by the quantum dot (A), the green light emitted by the quantum dot (B), and the blue light transmitting the quantum dot layer. Otherwise, in a case where the ultraviolet light is caused to be incident on the quantum dot layer including the quantum dots (A), (B), and (C), as the excitation light, white light may be realized by the red light emitted by the quantum dot (A), the green light emitted by the quantum dot (B), and the blue light emitted by the quantum dot (C).

As the quantum dot, a tetrapod-type quantum dot or a so-called quantum rod which has a rod shape and directivity and emits polarized light may be used.

As described above, in the wavelength conversion film 24, the wavelength conversion layer 30 is formed by dispersing a quantum dot or the like as a matrix of a resin or the like.

Here, as the matrix, well-known matrices used in the quantum dot layer may be used, but it is preferable to be obtained by curing the polymerizable composition including at least two or more polymerizable compounds. The polymerizable groups of the at least two or more polymerizable compounds which are used together may be identical to or different from each other, but it is preferable that the at least two or more kinds of the compounds have at least one or more common polymerizable groups.

Types of the polymerizable group are not particularly limited, but a (meth)acrylate group, a vinyl group, an epoxy group, or an oxetanyl group is preferable, a (meth)acrylate group is more preferable, and an acrylate group is even more preferable.

The polymerizable compound that becomes the matrix of the wavelength conversion layer 30 preferably includes at least one of the first polymerizable compounds including monofunctional polymerizable compounds and at least one of the second polymerizable compound including polyfunctional polymerizable compounds.

Specifically, examples thereof include an aspect of including the first polymerizable compound and the second polymerizable compound as follows.

<First Polymerizable Compound>

The first polymerizable compound is a monofunctional (meth)acrylate monomer and a monomer having one functional group selected from the group consisting of an epoxy group and an oxetanyl group.

Examples of the monofunctional (meth)acrylate monomer include acrylic acid and methacrylic acid, and derivatives of these, and specific examples thereof include an aliphatic or aromatic monomer having one polymerizable unsaturated bond (meth)acryloyl group of (meth)acrylic acid in the molecule and having an alkyl group of 1 to 30 carbon atoms. Specific examples thereof include compounds, but the present invention is not limited thereto.

Examples of an aliphatic monofunctional (meth)acrylate monomer include an alkyl (meth)acrylate in which an alkyl group has 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, and stearyl (meth)acrylate;

alkoxyalkyl (meth)acrylate in which an alkoxyalkyl group has 2 to 30 carbon atoms such as butoxyethyl (meth)acrylate;

aminoalkyl (meth)acrylate in which a (monoalkyl or dialkyl) aminoalkyl group has 1 to 20 carbon atoms in total such as N,N-dimethylaminoethyl (meth)acrylate;

(meth)acrylate of polyalkylene glycol alkyl ether in which an alkylene chain has 1 to 10 carbon atoms and terminal alkyl ether has 1 to 10 carbon atoms such as (meth)acrylate of diethylene glycol ethyl ether, (meth)acrylate of triethylene glycol butyl ether, (meth)acrylate of tetraethylene glycol monomethyl ether, (meth)acrylate of hexaethylene glycol monomethyl ether, monomethyl ether (meth)acrylate of octaethylene glycol, monomethyl ether (meth)acrylate of nonaethylene glycol, monomethyl ether (meth)acrylate of dipropylene glycol, monomethyl ether (meth)acrylate of heptapropylene glycol, and monoethyl ether (meth)acrylate of tetraethylene glycol;

(meth)acrylate of polyalkylene glycol aryl ether in which an alkylene chain has 1 to 30 carbon atoms and terminal aryl ether has 6 to 20 carbon atoms such as (meth)acrylate of hexaethylene glycol phenyl ether;

(meth)acrylate having an alicyclic structure and a total carbon number of 4 to 30 such as cyclohexyl (meth)acrylate, dicyclopentanyl (meth)acrylate, isobornyl (meth)acrylate, and methylene oxide addition cyclodecatriene (meth)acrylate; fluorinated alkyl (meth)acrylate having a total carbon number of 4 to 30 such as heptadecafluorodecyl (meth)acrylate;

(meth)acrylate having a hydroxyl group such as 2-hydroxyethyl (meth)acrylate, 3-hydroxypropyl (meth)acrylate, 4-hydroxybutyl (meth)acrylate, mono(meth)acrylate of triethylene glycol, tetraethylene glycol mono(meth)acrylate, hexaethylene glycol mono(meth)acrylate, octapropylene glycol mono(meth)acrylate, and mono(meth)acrylate of glycerol;

(meth)acrylate having a glycidyl group such as glycidyl (meth)acrylate;

polyethylene glycol mono(meth)acrylate having an alkylene chain having 1 to 30 carbon atoms such as tetraethylene glycol mono(meth)acrylate, hexaethylene glycol mono(meth)acrylate, and octapropylene glycol mono(meth)acrylate; and (meth)acrylamide such as (meth)acrylamide, N,N-dimethyl (meth)acrylamide, N-isopropyl (meth)acrylamide, 2-hydroxyethyl (meth)acrylamide, and acryloyl morpholine.

Examples of the aromatic monofunctional acrylate monomer include aralkyl (meth)acrylate having an aralkyl group having 7 to 20 carbon atoms such as benzyl (meth)acrylate.

The first polymerizable compound is preferably aliphatic or aromatic alkyl (meth)acrylate in which an alkyl group has 4 to 30 carbon atoms and more preferably n-octyl (meth)acrylate, lauryl (meth)acrylate, stearyl (meth)acrylate, cyclohexyl (meth)acrylate, dicyclopentanyl (meth)acrylate, isobornyl (meth)acrylate, and methylene oxide-added cyclodecatriene (meth)acrylate. This is because dispersibility of quantum dots is improved. As the dispersibility of the quantum dots is improved, the light intensity orthogonal to the emission surface from the wavelength conversion layer increases, and thus the improvement is effective for improving front brightness and front contrast.

Examples of a monofunctional epoxy compound having one epoxy group include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, 3-vinylcyclohexene oxide, and 4-vinylcyclohexene oxide.

As an example of the monofunctional oxetane compound having one oxetanyl group, a compound obtained by suitably substituting an epoxy group of a monofunctional epoxy compound with an oxetane group may be used. As the compound having an oxetane ring, a monofunctional compound out of oxetane compounds disclosed in JP2003-341217A and JP2004-091556A may be suitably selected.

The content of the first polymerizable compound is preferably 5 to 99.9 parts by mass and more preferably 20 to 85 parts by mass with respect to the total mass of 100 parts by mass of the first polymerizable compound and the second polymerizable compound. The reason is described below.

<Second Polymerizable Compound>

The second polymerizable compound is a polyfunctional (meth)acrylate monomer and a monomer having two or more functional groups selected from the group consisting of an epoxy group and an oxetanyl group in a molecule.

Among difunctional or higher functional polyfunctional (meth)acrylate monomers, preferable examples of the difunctional (meth)acrylate monomer include neopentyl glycol di(meth)acrylate, 1,6-hexanediol di(meth)acrylate, 1,9- nonanediol di(meth)acrylate, 1,10-decanediol diacrylate, tripropylene glycol di(meth)acrylate, ethylene glycol di(meth)acrylate, tetraethylene glycol di(meth)acrylate, hydroxypivalic acid neopentyl glycol di(meth)acrylate, polyethypylene glycol di(meth)acrylate, tricyclodecane dimethanol diacrylate, and ethoxylated bisphenol A diacrylate.

Among the difunctional or higher functional polyfunctional (meth)acrylate monomers, preferable examples of the trifunctional or higher functional (meth)acrylate monomer include epichlorohydrin (ECH)-modified glycerol tri(meth)acrylate, ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, dipentaerythritol penta(meth)acrylate, caprolactone-modified dipentaerythritol hexa(meth)acrylate, dipentaerythritol hydroxypenta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxytetra(meth)acrylate, and pentaerythritol tetra(meth)acrylate.

As the polyfunctional monomer, a (meth)acrylate monomer having a urethane bond in the molecule, and specific examples thereof include an adduct of tolylene diisocyanate (TDI) and hydroxyethyl acrylate, an adduct of isophorone diisocyanate (IPDI) and hydroxyethyl acrylate, an adduct of hexamethylene diisocyanate (HDI) and pentaerythritol triacrylate (PETA) a compound manufactured by causing an adduct of TDI and PETA to react with isocyanate and dodecyloxyhydroxypropyl acrylate, and an adduct of 6,6 nylon and TDI, and an adduct of pentaerythritol, TDI, and hydroxyethyl acrylate.

As the monomer having two or more functional groups selected from the group consisting of an epoxy group and an oxetanyl group, for example, an aliphatic cyclic epoxy compound, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers; polyglycidyl ethers of polyether polyols obtained by adding one or more alkylene oxides to aliphatic polyhydric alcohol such as ethylene glycol, propylene glycol, and glycerin; diglycidyl esters of aliphatic long chain dibasic acid; glycidyl esters of higher fatty acid; and a compound including epoxycycloalkane are suitably used.

Examples of the commercially available product that may be suitably used as a monomer having two or more functional groups selected from the group consisting of an epoxy group and an oxetanyl group include CELLOXIDE 2021P and CELLOXIDE 8000 manufactured by Daicel Corporation and 4-vinylcyclohexene dioxide manufactured by Sigma-Aldrich Co. Llc.

A method of manufacturing the monomer having two or more functional groups selected from the group consisting of an epoxy group and an oxetanyl group is not particularly limited, but the synthesis may be performed with reference to Maruzen K. K. Experimental Chemistry Course, 4th Edition, 20, Organic synthesis II, 213~, 1992, Ed. by Alfred Hasfner, Ed. by Alfred Hasfner, The chemistry of heterocyclic compounds-Small Ring Heterocycles part 3 Oxiranes, John & Wiley and Sons, An Interscience Publication, New York, 1985, Yoshimura, Adhesion, Vol. 29, No. 12, 32, 1985, Yoshimura, Adhesion, Vol. 30, No. 5, 42, 1986, Yoshimura, Adhesion, Vol. 30, No. 7, 42, 1986, JP1999-100378A (JP-H11-100378A), JP2906245B, and JP2926262B.

The content of the second polymerizable compound is preferably 0.1 to 95 parts by mass and preferably 15 to 80 parts by mass with respect to the total mass of 100 parts by mass of the first polymerizable compound and the second polymerizable compound. The reason is described below.

The matrix for forming the wavelength conversion layer 30, in other words, the polymerizable composition that becomes the wavelength conversion layer 30, may include necessary components such as a viscosity regulator and a solvent, if necessary. In other words, the polymerizable composition that becomes the wavelength conversion layer 30 is a polymerizable composition for forming the wavelength conversion layer 30.

<Viscosity Regulator>

The polymerizable composition may include a viscosity regulator, if necessary. The viscosity regulator is preferably a filler having a particle diameter of 5 to 300 nm. The viscosity regulator is preferably a thixotropic agent for providing thixotropy properties. According to the present invention, thixotropy properties refer to properties of reducing the viscosity with increasing the shear rate in a liquid composition, and the thixotropic agent refers to a material that is included in a liquid composition and has a function of providing thixotropy properties to the composition.

Specific examples of the thixotropic agent include fumed silica, alumina, silicon nitride, titanium dioxide, calcium carbonate, zinc oxide, talc, mica, feldspar, kaolinite (kaolin clay), pyrophylite (wax rock clay), sericite (silk mica), bentonite, smectite vermiculite (montmorillonite, beidellite, non-toronite, and saponite), organic bentonite, and organic smectite.

In the polymerizable composition for forming the wavelength conversion layer 30, the viscosity is 3 to 50 mPa·s in a case where a shear rate is 500 $s^{-1}$ and preferably 100 mPa·s or more in a case where a shear rate is 1 $s^{-1}$. In this manner, in order to adjust the viscosity, it is preferable to use the thixotropic agent.

The reason why that the viscosity of the polymerizable composition is preferably 3 to 50 mPa·s in a case where the shear rate is 500 $s^{-1}$ and preferably 100 mPa·s or more in a case where a shear rate is 1 $s^{-1}$ is as follows.

Examples of the method of manufacturing the wavelength conversion film 24 (the wavelength conversion layer 30) include a method including a step of preparing two sheets of the barrier films 32, coating a front surface of the gas barrier film 32 on one side with the polymerizable composition that becomes the wavelength conversion layer 30, bonding the other barrier film 32 to the coated polymerizable composition and curing the polymerizable composition, to form the wavelength conversion layer 30.

In the description below, the gas barrier film 32 that is coated with the polymerizable composition is referred to as a first substrate, and the other gas barrier film 32 that is bonded to the polymerizable composition with which the first substrate is coated is referred to as a second substrate.

In this production method, it is preferable that, in a case where the first substrate is coated with the polymerizable composition, the polymerizable composition is uniformly applied not to form coating streaks such that the film thickness of the coating film is uniform. For this reason, in view of coatability and levelability, it is preferable that the viscosity of the polymerizable composition is low. Meanwhile, in order to bond the second substrate on the polymerizable composition applied to the first substrate, in order to uniformly the second substrate, it is preferable that it is preferable that the resistance to pressure during bonding is high, and in this point of view, it is preferable that the viscosity of the polymerizable composition is high.

The shear rate of 500 $s^{-1}$ is a representative value of a shear rate applied to the polymerizable composition applied to the first substrate, and the shear rate of 1 $s^{-1}$ is a representative value of a shear rate applied to the polymerizable composition immediately before the bonding of the second substrate to the polymerizable composition. The shear rate 1 $s^{-1}$ is merely a representative value. In a case where the second substrate is bonded to the polymerizable composition applied to the first substrate, if the first substrate and the second substrate are transported at the same rate and bonded to each other, the shear rate applied to the polymerizable composition is almost 0 $s^{-1}$, and the shear rate applied to the polymerizable composition in the actual manufacturing process is not limited to 1 $s^{-1}$. Meanwhile, the shear rate of 500 $s^{-1}$ is merely a representative value in the same manner, and the shear rate applied to the polymerizable composition in the actual manufacturing process is not limited to 500 $s^{-1}$. In view of uniformly coating and bonding, the viscosity of the polymerizable composition is 3 to 50 mPa·s, in a case where the representative value of the shear rate applied to the polymerizable composition in a case of coating the first substrate with the polymerizable composition is 500 $s^{-1}$, and it is preferable that the viscosity thereof is adjusted to be 100 mPa·s or more in a case where the representative value of the shear rate applied to the polymerizable composition immediately before the second substrate is bonded to the polymerizable composition applied to the first substrate is 1 $s^{-1}$.

<Solvent>

The polymerizable composition that becomes the wavelength conversion layer 30 may include a solvent, if necessary. The type and the addition amount of the solvent used in this case are not particularly limited. For example, as the solvent, the organic solvent may be used singly or two or more kinds thereof may be used in a mixture.

The polymerizable composition that becomes the wavelength conversion layer 30 may include a compound having a fluorine atom such as trifluoroethyl (meth)acrylate, pentafluoroethyl (meth)acrylate, (perfluorobutyl) ethyl (meth)acrylate, perfluorobutyl-hydroxypropyl (meth)acrylate, (perfluorohexyl) ethyl (meth)acrylate, octafluoropentyl (meth)acrylate, perfluorooctylethyl (meth)acrylate, and tetrafluoropropyl (meth)acrylate.

The coatability may be improved by including these compounds.

<Hindered Amine Compound>

The polymerizable composition that becomes the wavelength conversion layer 30 may include a hindered amine compound, if necessary.

Examples of the hindered amine compound include 2,2,6,6-tetramethyl-4-piperidyl benzoate, N-(2,2,6,6-tetramethyl-4-piperidyl) dodecylsuccinimide, 1-[(3,5-di-tert-butyl-4-hydroxyphenyl) propionyloxyethyl]-2,2,6,6-tetramethyl-4-piperidyl-(3,5-di-tert-butyl-4-hydroxyphenyl) propionate, bis(2,2,6,6-tetramethyl-4-piperidyl) sebacate, bis(1,2,2,6,6-pentamethyl-4-piperidyl) sebacate, bis(1,2,2,6,6-pentamethyl-4-piperidyl)-2-butyl-2-(3,5-di-tert-butyl-4-hydroxybenzyl) malonate, N,N'-bis(2,2,6,6-tetramethyl-4-piperidyl) hexamethylenediamine, tetra(2,2,6,6-tetramethyl-4-piperidyl) butane tetracarboxylate, tetra(1,2,2,6,6-pentamethyl-4-piperidyl) butane tetracarboxylate, bis(2,2,6,6-tetramethyl-4-piperidyl) di(tridecyl) butane tetracarboxylate, bis(1,2,2,6,6-pentamethyl-4-piperidyl) di(tridecyl) butane tetracarboxylate, 3,9-bis[1,1-dimethyl-2-{tris(2,2,6,6-tetramethyl-4-piperidyloxycarbonyloxy) butylcarbonyloxy} ethyl]-2,4,8,10-tetraoxaspiro [5.5] undecane, 3,9-bis[1,1-dimethyl-2-{tris(1,2,2,6,6-pentamethyl-4-piperidyloxycarbonyloxy) butylcarbonyloxy} ethyl]-2,4,8,10-tetraoxaspiro [5.5] undecane, 1,5,8,12-tetrakis[4,6-bis {N-(2,2,6,6-tetramethyl-4-piperidyl) butylamino}-1,3,5-triazin-2-yl]-1,5,8,12-tetraazadodecane, a 1-(2-hydroxyethyl)-2,2,6,6-tetramethyl-4-piperidinol/dimethyl succinate condensate, a 2-tert-octylamino-4,6-dichloro-s-triazine/N,N'-bis(2,2,6,6-tetramethyl-4-piperidyl) hexamethylenediamine condensate, an N,N'-bis(2,2,6,6-tetramethyl-4-piperidyl) hexamethylenediamine/dibromoethane condensate, bis(1-undecanoxy-2,2,6,6-tetramethylpiperidin-4-yl) carbonate, 1,2,2,6,6-pentamethyl-4-piperidyl methacrylate, and 2,2,6,6-tetramethyl-4-piperidyl methacrylate.

By adding the hindered amine compound, it is possible to restrain the wavelength conversion layer 30 from being colored to the light of high illuminance.

In the wavelength conversion layer 30, the amount of the resin that becomes the matrix may be appropriately determined according to the types of functional materials included in the wavelength conversion layer 30.

In the illustrated example, since the wavelength conversion layer 30 is a quantum dot layer, the resin that becomes the matrix is preferably 90 to 99.9 parts by mass and more preferably 92 to 99 parts by mass with respect to the total amount 100 parts by mass of the quantum dot layer.

The thickness of the wavelength conversion layer 30 may be also suitably determined according to the types of the wavelength conversion layer 30 or the application of the wavelength conversion film 24.

In the illustrated example, since the wavelength conversion layer 30 is a quantum dot layer, and thus in view of handleability and light emission characteristics, the thickness of the wavelength conversion layer 30 is preferably 5 to 200 μm and more preferably 10 to 150 μm.

The thickness of the wavelength conversion layer 30 intends to an average thickness. The average thickness is obtained by measuring thicknesses of the wavelength conversion layer 30 at 10 random points and arithmetically averaging the thicknesses.

a polymerization initiator, a silane coupling agent, and the like may be added to the polymerizable composition that becomes the wavelength conversion layer 30 such as the quantum dot layer, if necessary.

The wavelength conversion film 24 has a configuration in which the wavelength conversion layer 30 is sandwiched between two sheets of the gas barrier films 32. In the following descriptions, the "gas barrier film 32" is also referred to as a "barrier film 32".

The barrier film 32 is a well-known gas barrier film obtained by forming a gas barrier layer through which oxygen or the like does not transmit the front surface of the supporting substrate. According to the present invention, by sandwiching the wavelength conversion layer 30 between two sheets of the barrier films 32, oxygen and moisture are prevented from entering from the main surface of the wavelength conversion layer 30, such that the deterioration of the wavelength conversion layer 30 due to oxygen and moisture is prevented.

The oxygen permeability of the barrier film 32 is preferably $1\times10^{-2}$ cc/(m$^2$·day·atm) or less. Specifically, the water vapor permeability of the barrier film 32 is preferably $1\times10^{-3}$ g/(m$^2$·day) or less.

In a case where the barrier film 32 having the low oxygen permeability and the low water vapor permeability, that is, having high gas barrier properties is used, it is possible to prevent the infiltration of oxygen or moisture to the wavelength conversion layer 30 and suitably prevent the deterioration of the wavelength conversion layer 30.

For example, the oxygen permeability may be measured under the conditions of the temperature of 25° C. and the relative humidity of 60% RH with a measuring device (manufactured by Nippon API Co., Ltd.), according to the APIMS method (atmospheric pressure ionization mass spectrometry). For example, the water vapor permeability is measured by the MOCON method under conditions of the temperature of 40° C. and a relative humidity of 90% RH. In a case where the water vapor permeability is greater than the measurement limit of the MOCON method, the water vapor permeability is measured by the calcium corrosion method (method disclosed in JP2005-283561A) under the same conditions.

The thickness of the barrier film 32 is preferably 5 to 100 μm, more preferably 10 to 70 μm, and even more preferably 15 to 55 μm.

It is preferable that the thickness of the barrier film 32 is 5 μm or more, since the thickness of the wavelength conversion layer 30 may be caused to be uniform in a case of forming the wavelength conversion layer 30 between two barrier films 32. It is preferable that the thickness of the barrier film 32 is caused to be 100 μm or less, since the entire thickness of the wavelength conversion film 24 including the wavelength conversion layer 30 may be caused to be thin.

The barrier film 32 is preferably transparent.

The barrier film 32 may have a rigid sheet shape or may have a flexible film shape. The barrier film 32 may have an elongate shape capable of being wound or may have a sheet-like shape that may be cut into predetermined dimensions in advance.

Various kinds of well-known gas barrier films obtained by forming a gas barrier layer exhibiting gas barrier properties on a supporting substrate can be used as the barrier film 32.

For example, an organic-inorganic lamination type gas barrier film obtained by forming one or more sets of the combination of a supporting substrate, an inorganic layer as a gas barrier layer on a surface of a supporting substrate, and an organic layer that becomes a base substrate (formation surface) of the inorganic layer may be suitably used as the suitable barrier film 32.

Examples thereof include an organic-inorganic lamination type gas barrier film having one set of the combination of an inorganic layer and a base substrate organic layer, which has an organic layer on one front surface of the supporting substrate and has an inorganic layer on the front surface of the organic layer using an organic layer as a base substrate layer.

Another example thereof includes an organic-inorganic lamination type gas barrier film having two sets of the combination of inorganic layers and a base substrate organic layers, which has an organic layer on one front surface of the supporting substrate, has an inorganic layer on the front surface of the organic layer formed of the organic layer as a base substrate layer, has a second organic layer on the inorganic layer, and has a second inorganic layer formed of the second organic layer as a base substrate layer.

Otherwise, an organic-inorganic lamination type gas barrier film having three or more sets of inorganic layers and base substrate organic layers may be used. Basically, as more sets of the combination of inorganic layers and base substrate organic layers are provided, the gas barrier film becomes thick, but higher gas barrier properties may be obtained.

In the following descriptions, the "organic-inorganic lamination type gas barrier film" is also referred to as a "lamination type barrier film".

In the lamination type barrier film, gas barrier properties are mainly exhibited in the inorganic layers.

In order to use a lamination type barrier film as the barrier film 32 of the wavelength conversion film 24, in all layer configurations, it is preferable that an upper most layer, that is, an outermost layer on an opposite side of the supporting substrate, is an inorganic layer, and an inorganic layer is provided on the inner side, that is, on the wavelength conversion layer 30 side. That is, in a case where the lamination type barrier film is used as the barrier film 32 of the wavelength conversion film 24, it is preferable that, as a state in which the inorganic layer comes into contact with the wavelength conversion layer 30, the wavelength conversion layer 30 is sandwiched between the barrier films 32. Accordingly, it is possible to suitably prevent infiltration of oxygen or the like from the end face of the organic layer to the wavelength conversion layer 30.

As the supporting substrate of the lamination type barrier film, various kinds of supports used as supporting substrates in well-known gas barrier films may be used.

Among these, in view of easiness of thinning, lightweight and suitability for flexibility, or the like, a film including various kinds of plastics (polymer materials/resin materials) are suitably used.

Specifically, suitable examples thereof include resin films including polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, polymethylmethacrylate resin (PMMA), polycarbonate (PC), polyacrylate, polymethacrylate, polypropylene (PP), polystyrene (PS), an acrylonitrile-butadiene-stylene copolymer (ABS), a cycloolefin copolymer (COC), a cycloolefin polymer (COP), and triacetylcellulose (TAC).

The thickness of the supporting substrate may be suitably set according to the application or the size thereof. According to the research by the present inventors, the thickness of the supporting substrate is preferably about 10 to 100 μm. In a case of where the thickness of the supporting substrate is caused to be in this range, preferable results in view of lightweight or thinning may be obtained.

With respect to the supporting substrate, functions such as anti-reflection, the phase difference control, the light extraction efficiency improvement, and the like may be provided on the front surface of such a plastic film.

As described above, in the lamination type barrier film, the gas barrier layer mainly has an inorganic layer exhibiting gas barrier properties and an organic layer that becomes a base substrate layer of the inorganic layer.

In the lamination type gas barrier film, it is preferable that the upper most layer is an inorganic layer, and the inorganic layer side faces the wavelength conversion layer 30. However, the lamination type barrier film may have an organic layer for protecting the inorganic layer on the upper most layer, if necessary. However, the lamination type gas barrier film may have an organic layer for securing the adhesiveness to the wavelength conversion layer 30 on the upper most layer, if necessary. The organic layer for securing the adhesiveness may function as a protective layer of the inorganic layer.

The organic layer becomes a base substrate layer of an inorganic layer that mainly exhibits gas barrier properties in the lamination type barrier film.

As the organic layer, various kinds of layers used as the organic layer in the well-known lamination type gas barrier film may be used. For example, as the organic layer, a layer formed of a film which is obtained by using an organic compound as a main component and which is basically formed by crosslinking a monomer and/or an oligomer may be used.

The lamination type barrier film has an organic layer that becomes a base substrate of an inorganic layer, such that the unevenness of the front surface of the supporting substrate or foreign matters and the like adhering to the front surface may be embedded so as to form an adequate deposition surface of the inorganic layer. As a result, an adequate inorganic layer without fractures or cracks may be formed on the entire deposition surface. High gas barrier properties in which the water vapor permeability is $1 \times 10^{-2}$ cc/($m^2 \cdot day \cdot atm$) or less, and the oxygen permeability is $1 \times 10^{-3}$ g/($m^2 \cdot day$) or less may be obtained.

In a case where the lamination type barrier film has an organic layer that becomes this base substrate, this organic layer functions as the cushion of the inorganic layer. Therefore, in a case where the inorganic layer is impacted from the outside or the like, the damage of the inorganic layer may be prevented by the cushioning effect of the organic layer.

In the lamination type barrier film, the inorganic layer adequately exhibits gas barrier properties, and deterioration of the wavelength conversion layer 30 due to moisture or oxygen may be suitably prevented.

In the lamination type barrier film, as the material for forming the organic layer, various kinds of organic compounds (resins, polymer compounds) may be used.

Particularly, suitable examples thereof include films of a thermoplastic resin such as polyester, acrylic resin, methacrylic resin, a methacrylic acid-maleic acid copolymer, polystyrene, transparent fluororesin, polyimide, fluorinated polyimide, polyamide, polyamide imide, polyether imide, cellulose acylate, polyurethane, polyether ether ketone, polycarbonate, alicyclic polyolefin, polyarylate, polyethersulfone, polysulfone, fluorene ring modified polycarbonate, alicyclic modified polycarbonate, fluorene ring modified polyester, an acryloyl compound polysiloxane, or other organosilicon compounds. The plurality of these may be used in combination.

Among these, in view of excellent glass transition temperature and excellent strength, an organic layer including a polymer of a cationically polymerizable compound having a radically polymerizable compound and/or an ether group as a functional group is suitable.

Among these, particularly, in addition to the strength, in view of a low refractive index, high transparency, and excellent optical properties, an acrylic resin and a methacrylic resin that has a polymer of a monomer or an oligomer of acrylate and/or methacrylate as a main component and that has a glass transition temperature of 120° C. or more are suitably exemplified as an organic layer. Among these, particularly, acrylic resins and methacrylic resins that have polymers of difunctional or higher functional, particularly, trifunctional or higher functional monomers or oligomers of acrylate and/or methacrylate such as dipropylene glycol di(meth)acrylate (DPGDA), trimethylolpropane tri(meth)acrylate (TMPTA), and dipentaerythritol hexa(meth)acrylate (DPHA), as main components are suitably exemplified. A plurality of these acrylic resins and methacrylic resins may be preferably used.

In a case where the organic layer is formed with such an acrylic resin or methacrylic resin, an inorganic layer may be formed on a base substrate with a firm skeleton, and thus a denser inorganic layer having high gas barrier properties may be formed.

The thickness of the organic layer is preferably 1 to 5 μm.

In a case where the thickness of the organic layer is 1 μm or more, an adequate deposition surface of the inorganic layer may be more suitably obtained, and thus an adequate inorganic layer without fractures, cracks, or the like may be formed on the entire deposition surface.

In a case where the thickness of the organic layer is caused to be 5 μm or less, it is possible to suitably prevent the problems occurring due to a too thick organic layer such as cracks of the organic layer or curling of a lamination type barrier film.

In view of the above, it is more preferable that the thickness of the organic layer is 1 to 3 μm.

In a case where the lamination type barrier film has a plurality of organic layers as base substrate layers, the thicknesses of the organic layers may be identical to or different from each other.

In a case where the lamination type barrier film has a plurality of organic layers, materials for forming the respective organic layers may be identical to or different from each other. However, in view of productivity, it is preferable that all of the organic layers are formed with the same materials.

It is preferable that the organic layer is formed by the well-known method such as a coating method or a flash vapor deposition method.

In order to improve adhesiveness to an inorganic layer that becomes an underlayer of an organic layer, it is preferable that the organic layer contains a silane coupling agent.

An inorganic layer formed of this organic layer as a base substrate is formed on the organic layer. The inorganic layer is a film formed of an inorganic compound as a main component and mainly exhibits gas barrier properties in the lamination type barrier film.

As the inorganic layer, various kinds of films that exhibit gas barrier properties and that includes metal oxide, metal nitride, metal carbide, metal carbonitride may be used.

Specifically, a film formed of an inorganic compound, for example, metal oxide such as aluminum oxide, magnesium oxide, tantalum oxide, zirconium oxide, titanium oxide, and indium tin oxide (ITO), metal nitride such as aluminum nitride; metal carbide such as aluminum carbide; silicon oxide such as silicon oxide, silicon oxynitride, silicon oxycarbide, and silicon oxynitride carbide; silicon nitride such as silicon nitride carbide; silicon carbide such as silicon carbide; hydride thereof; a mixture of two or more of these; and a hydrogen-containing matter of these is suitably exemplified. According to the present invention, silicon is also considered as metal.

Particularly, in view of exhibiting high transparency and excellent gas barrier properties, a film including a silicon compound such as silicon oxide, silicon nitride, silicon oxynitride, and silicon oxide is suitably exemplified. Among these, particularly, a film including silicon nitride has high transparency, in addition to excellent gas barrier properties and is suitably exemplified.

In a case where the lamination type barrier film has a plurality of inorganic layers, materials for forming the inorganic layers may be identical to or different from each other. However, in view of productivity, it is preferable that all of the inorganic layers are formed with the same materials.

With respect to the thickness of the inorganic layer, the thickness capable of exhibiting desired gas barrier properties may be suitably determined according to the forming material. According to the research by the present inventors, the thickness of the inorganic layer is preferably 10 to 200 nm.

In a case where the thickness of the inorganic layer is 10 nm or more, it is possible to form an inorganic layer that stably exhibits sufficient gas barrier properties. The inorganic layer is generally brittle, and in a case where the inorganic layer is too thick, it is likely that fractures, cracks, peeling and the like may occur. However, in a case where the thickness of the inorganic layer is caused to be 200 nm or less, occurrence of the fractures may be prevented.

Considering the above, the thickness of the inorganic layer is preferably 10 to 100 nm and more preferably 15 to 75 nm.

In a case where the lamination type barrier film has a plurality of inorganic layers, the thicknesses of the respective inorganic layers may be identical to or different from each other.

The inorganic layer may be formed by the well-known method according to the forming material. Specifically, plasma CVD such as capacitively coupled plasma (CCP)-chemical vapor deposition (CVD) and inductively coupled plasma (ICP)-CVD, sputtering such as magnetron sputtering and reactive sputtering, and a vapor phase deposition method such as vapor deposition are suitably exemplified.

The area (the size in the plane direction) of the wavelength conversion film 24 formed by sandwiching the wavelength conversion layer 30 with the barrier films 32 is not limited and may be appropriately set according to the size of the planar lighting device 10 or the like.

Specifically, as in the illustrated example, in the backlight film 16 having a plurality of the wavelength conversion films 24 that are spaced from each other in the plane direction of the support 20, the area of the wavelength conversion film 24 is preferably 1,000 mm² or less.

In a case where the area of the wavelength conversion film 24 is caused to be 1,000 mm² or less, it is preferable that the effect of appropriately reducing the use amount of the wavelength conversion films 24 by using a plurality of the small wavelength conversion films 24 to be spaced from each other.

The total area of the plurality of the wavelength conversion films 24 with respect to the area of the support 20 is not limited and may be appropriately set according to the number of the light sources 14, the area of the support 20, the brightness of the light required in the backlight film 16, or the like.

According to the research of the present inventors, it is preferable that the total area of the wavelength conversion films 24 with respect to the area of the support 20 is caused to be 20% or less, since the use amount of the wavelength conversion films 24 can be sufficiently reduced.

In the illustrated example, the shape (planar shape=shape in the plane direction) of the wavelength conversion film 24 is a square, but the present invention is not limited thereto, wavelength conversion films having various shapes can be used.

Examples thereof include one of a rectangular shape, a circular shape, a triangular shape, and a hexagonal shape.

Among these, a square shape is suitably used because the area ratio of incidence rays (beam spot) from the light source 14 to the area of the wavelength conversion film 24 can be increased.

The thickness of the wavelength conversion film 24 is not limited and may be appropriately set according to a material for forming the wavelength conversion layer 30, a material for forming the barrier film 32, and a layer configuration.

That is, the preferable thickness of the wavelength conversion film 24 is basically a thickness corresponding to the preferable thickness of the wavelength conversion layer 30 and the preferable thickness of the barrier film 32.

The wavelength conversion film 24 may have a light diffusing layer on the surface of the barrier film 32 on an opposite side of the support 20. That is, in a case where the barrier film 32 is the lamination type barrier film may have a light diffusing layer on the surface of the supporting substrate on an opposite side of the support 20.

A light diffusing layer included in the wavelength conversion film 24 contributes to increase of an amount of excitation light incident on the wavelength conversion layer 30 and an intensity of light emitted from the wavelength conversion layer 30, and accordingly the brightness of the planar lighting device 10, that is, an LCD using the planar lighting device 10, or the like can be improved.

Well-known light diffusing layers can be used.

Examples thereof include a light diffusing layer obtained by dispersing a light diffusing agent in a binder (matrix) such as a resin. In this case, various kinds of binders that are used for the light diffusing layer obtained by dispersing the light diffusing agent in the binder, such as various resins can be used. Various kinds of light diffusing agents that are used for the light diffusing layer obtained by dispersing a light diffusing agent in a binder, such as various kinds of inorganic particles can be used. That is, in this light diffusing layer, in a case where a refractive index n1 of the binder and a refractive index n2 of the light diffusing agent satisfies a relationship of n1>n2, as the binder and the light diffusing agent, various kinds of well-known materials can be used.

In a case where the wavelength conversion film 24 has a light diffusing layer, it is preferable that the wavelength conversion film 24 does not have a light diffusing layer at a position where the reflective layer 26 is formed. That is, it is preferable that the reflective layer 26 is directly provided on the supporting substrate of the barrier film 32.

Accordingly, it is possible to cause the film thickness distribution of the reflective layer 26 described below can be appropriately set as ±5% or less.

In the wavelength conversion film 24, it is preferable that an end face is covered with an end face sealing layer including a material exhibiting gas barrier properties. Accordingly, it is possible to prevent infiltration of oxygen from an end face of the wavelength conversion film 24 to the wavelength conversion layer 30.

As the end face sealing layer, various kinds of layers including a material having gas barrier properties for inhibiting passing of oxygen or moisture, such as a metal layer such as a plating layer, an inorganic compound layer such as a silicon oxide layer and/or a silicon nitride layer, and a resin layer including a resin material such as an epoxy resin or a polyvinyl alcohol resin may be used. The end face sealing layer may have a multilayer configuration such as a configuration of including a base substrate metal layer and a plating layer and a configuration including a polyvinyl alcohol layer as an underlayer (the wavelength conversion film 24 side) and an epoxy resin layer as an upper layer.

The reflective layer 26 is provided on the surface on an opposite side of the support 20 of the wavelength conversion film 24, that is, on an incidence surface of the light from the light source 14. In the illustrated example, the reflective layer 26 is a circular sheet-like material (plate-like material, film-like material). As the preferable aspect, the reflective layer 26 and the wavelength conversion film 24 are disposed such that the center of the circle and the center of the square coincide with each other.

In the planar lighting device 10, one of the light sources 14 is provided to one sheet of the wavelength conversion film 24. In the illustrated example, as the preferable aspect, the light source 14 is disposed such that the optical axis coincides with the center of the circular reflective layer 26 in the plane direction.

As the preferable aspect, the backlight film 16 of the illustrated example has a configuration of having the support 20 and having the plurality of the small wavelength conversion films 24 on one main surface of the support 20 to be spaced from each other. Specifically, as illustrated in FIG. 2, the backlight film 16 has a configuration in which the wavelength conversion films 24 are disposed in a square grid shape.

Since the backlight film 16 has this configuration, the use amount of the wavelength conversion film 24 (the wavelength conversion layer 30 (quantum dot layer)) can be greatly decreased while the emission properties of the light required in the planar lighting device 10 are sufficiently secured, and also the cost is reduced.

Here, with respect to the backlight film 16, it is preferable that all of the light emitted from the light source 14 is incident on the wavelength conversion film 24 in order to effectively use the wavelength conversion film 24. By causing all of the light emitted from the light source 14 to be incident on the wavelength conversion film 24, the optical design of the planar lighting device can be easily made.

As the light source 14 that causes light (excitation light) to be incident on the wavelength conversion film 24 by using a phosphor, an LED is preferably used. As well known, the light emitted from the LED is diffused light, and a divergence angle of the light is generally about 60°.

Therefore, in order to cause all of the light emitted from the light source 14 to be incident on the small wavelength conversion films 24, it is required to cause the wavelength conversion film 24 and the light source 14 to be near to each other.

In a case where the wavelength conversion film 24 and the light source 14 are disposed to be near to each other, the brightness of the light incident on the wavelength conversion film increases. In a case where light having high brightness is incident, the temperature increase of the wavelength conversion film by the incident light increases.

However, according to the research of the present inventors, in a case where the light source 14 and the wavelength conversion film 24 are disposed to be near to each other, due to light having high brightness and the heat by the light, the resin or the quantum dots that form the wavelength conversion layer 30 are deteriorated (light deterioration and heat deterioration), such that the wavelength conversion layer 30 is deteriorated.

Particularly, with respect to the wavelength conversion film 24 of the illustrated example, the wavelength conversion layer 30 is a quantum dot layer obtained by using quantum dots, and thus a blue LED is used as the light source 14. As well known, blue light has a short wavelength and thus has strong energy. In addition to high light directivity and high peak brightness, the LED has a large amount of heat generation, and thus the resin or the like that forms the wavelength conversion layer 30 is easily deteriorated.

Therefore, in a case where the light source 14 and the wavelength conversion film 24 are disposed to be near to each other, the wavelength conversion layer 30 is deteriorated with time such that predetermined light may not be emitted, that is, the durability of the wavelength conversion film became insufficient.

In a case where the light source 14 and the wavelength conversion film 24 are near to each other, according to the output of the light source 14, the brightness of the light emitted by the light source 14, the material for forming the wavelength conversion layer 30, and the like, the wavelength conversion layer 30 is deteriorated due to light and heat in the same manner, and the durability of the wavelength conversion film 24 became insufficient.

Accordingly, the backlight film 16 of the embodiment of the present invention has the reflective layer 26 that reflects light on the incidence surface of light from the light source 14 of the wavelength conversion film 24. As the preferable aspect, the light source 14 is disposed such that the optical axis coincides with the center of the circular reflective layer 26 in the plane direction. In other words, the reflective layer 26 is provided such that the center coincides with the optical axis of the light source 14.

As the preferable aspect, the reflective layer 26 is provided in the center of the wavelength conversion film 24. As described above, the wavelength conversion film 24 has a square shape, and the reflective layer 26 has a circular shape. Therefore, the wavelength conversion film 24 and the reflective layer 26 are disposed such that the center of the square and the center of the circle coincide with each other.

In a case of having the reflective layer 26, even in a case where the wavelength conversion film 24 and the light source 14 are disposed so as to be near to each other, the reflective layer 26 reflects the light from the light source 14 by several %, and thus the light incident on the wavelength conversion film 24 is reduced, such that the deterioration of the wavelength conversion layer 30 caused by the light or the heat can be prevented.

Particularly, since intensity of light (light intensity distribution of beam spot) emitted from the light source 14 is strongest at the optical axis central part and decreases as it goes to the edge part, the deterioration of the wavelength conversion film 24 can be appropriately prevented by disposing the center of the reflective layer 26 and the optical axis of the light source 14 such that they coincide with each other.

However, as described above, the planar lighting device 10 with the backlight film 16 of the embodiment of the present invention is used in a backlight unit of an LCD or the like. Accordingly, in order to cause the light to be uniform in the plane direction of the LCD, a diffusion plate, two prism sheets orthogonally disposed on the ridge line, and the like are disposed on the light emission surface of the planar lighting device 10.

Therefore, as illustrated in FIGS. 1 and 2, even in a case where the wavelength conversion films 24 are two dimensionally disposed to be spaced from each other, the light that is incident on the liquid crystal display panel of the LCD can be caused to be substantially uniform in the plane direction.

According to the research of the present inventors, in a case where there is unevenness in the thickness of the reflective layer 26, color unevenness occurs in the light emitted from the wavelength conversion film 24, and accordingly, the color unevenness in the plane direction occurs in the light emitted from the backlight film 16, that is, the planar lighting device 10.

That is, the reflectance of the light by the reflective layer 26 is influenced by the thickness of the reflective layer 26. Therefore, in a case where there is unevenness in the thickness of the reflective layer 26, light intensity unevenness in the plane direction occurs in the light that is transmitted by the reflective layer 26 and is incident on the wavelength conversion film 24. As a result, the light emitted by the wavelength conversion film 24 has brightness unevenness in the plane direction, and accordingly, the color unevenness in the plane direction caused by the unevenness in thickness of the reflective layer 26 occurs in the light emitted from the wavelength conversion film 24.

The color unevenness of light emitted from the wavelength conversion film 24 that is caused by the thickness unevenness of the reflective layer 26 may not be sufficiently corrected even in a case where the diffusion plate and the prism sheet is disposed on the upper side of the planar lighting device. As a result, the color unevenness of the light of the backlight that is incident on the liquid crystal panel in the plane direction occurs, color unevenness occurs on the display image by the LCD.

Accordingly, with respect to the backlight film 16 of the present invention, the wavelength conversion film 24 has the reflective layer 26 for preventing the deterioration of the wavelength conversion layer 30 caused by the light or the heat, and the film thickness distribution of the reflective layer 26 is within 15%. That is, with respect to the backlight film 16 of the present invention, the film thickness of the reflective layer 26 provided in the wavelength conversion film 24 is distributed within ±5%.

Therefore, with respect to the backlight film 16 of the present invention, the wavelength conversion film 24 can emit the light not having color unevenness (having extremely scarce color unevenness) caused by the film thickness unevenness of the reflective layer 26. As a result, by using the backlight film 16 of the present invention, it is possible to cause the light of the backlight without the color unevenness in the plane direction to be incident on the liquid crystal panel, and the LCD can display a high quality image without the color unevenness.

In a case where the film thickness distribution of the reflective layer 26 is greater than ±5%, the color unevenness of the light emitted from the wavelength conversion film 24 which is caused by the film thickness unevenness of the reflective layer 26 becomes great, and thus in a case where the backlight film 16 is used for a backlight unit of an LCD, the color unevenness occurs in a display image.

Since the color unevenness of the light emitted from the wavelength conversion film 24 can be reduced, the film thickness distribution of the reflective layer 26 is preferably ±3% or less.

The film thickness distribution of the reflective layer 26 may be measured by well-known methods such as measuring a film thickness distribution of a layered material, a sheet-like material, a film-like material, and the like, which is bonded to a sheet-like material.

According to the present invention, with respect to the film thickness distribution, the film thickness distribution is determined by measuring the overall film thickness of the reflective layer, calculating the average film thickness, dividing the difference between the average film thickness and the maximum film thickness by the average film thickness, and dividing the difference between the average film thickness and the minimum film thickness by the average film thickness.

The film thickness of the reflective layer 26 may be measured by using a contact film thickness meter or a two-dimensional laser displacement meter.

The reflectance of the light by the reflective layer 26 is not particularly limited, and the reflectance that can sufficiently prevent the deterioration of the wavelength conversion layer 30 due to the light irradiated from the light source 14 may be appropriately set.

As described above, as the light source 14, a blue LED that emits blue light can be suitably used. Considering this, the reflective layer 26 reflects light (blue light) at a wavelength range of 420 to 490 nm preferably by 50% to 90% and more preferably by 70% to 80%. That is, blue light transmittance of the reflective layer 26 is preferably 10% to 50%.

It is preferable that reflectance of blue light by the reflective layer 26 is caused to be 50% or more, since the deterioration of the wavelength conversion layer 30 is appropriately prevented.

It is preferable that the reflectance of the blue light by the reflective layer 26 is 90% or less, since sufficient light (excitation light) can be incident on the wavelength conversion layer 30. As the reflectance of the blue light by the reflective layer 26 is higher, the color unevenness of the light emitted from the wavelength conversion film 24 which is caused by the film thickness unevenness of the reflective layer 26 easily occurs. In a case where the reflectance of the blue light by the reflective layer 26 is caused to be 90% and particularly 80% or less, the film thickness unevenness of the light emitted from the wavelength conversion film 24 which is caused by the color unevenness of the reflective layer 26 can be suppressed.

The thickness of the reflective layer 26 is not particularly limited and a thickness that can obtain required reflectance of the light can be appropriately set according to the material for forming the reflective layer 26 or the like.

According to the research of the present inventors, the thickness of the reflective layer 26 is preferably 10 μm or more. It is preferable that the thickness of the reflective layer 26 is caused to be 10 μm or more, since the deterioration of the wavelength conversion layer 30 caused by light or heat can be appropriately prevented.

The area (the size in the plane direction) of the reflective layer 26 is appropriately set according to the size of the wavelength conversion film 24.

Here, according to the research of the present inventors, the area of the reflective layer 26 is preferably 1% to 30% and more preferably 5% to 10% with respect to the area of the wavelength conversion film 24.

It is preferable that the area of the reflective layer 26 can be caused to be 1% or more with respect to the area of the wavelength conversion film 24, since the deterioration of the wavelength conversion layer 30 caused by light or heat can be appropriately prevented.

It is preferable that the area of the reflective layer 26 is caused to be 30% or less with respect to the area of the wavelength conversion film 24, since sufficient light can be caused to be incident on the wavelength conversion layer 30.

The shape of the reflective layer 26 is not limited to a circle in the illustrated example, and various shapes such as a square, a rectangle, an ellipse, and a triangle can be used. Generally, the beam spot shape of the light emitted from the light source 14 (LED) and incident on the wavelength conversion film 24 is a circle, and thus it is preferable that the shape of the reflective layer 26 is caused to be a circle, and the optical axis of the light source 14 and the center of the circle of the reflective layer 26 coincide with each other.

In a case where the shape of the reflective layer 26 is caused to be an ellipse or a rectangle, light from the plurality of light sources may be caused to be incident on one of the reflective layers 26.

As in the illustrated example, in a case where the backlight film has the plurality of the reflective layers 26, reflective layers having different shapes such as a circle or a square may be mixed with each other.

In the illustrated example, one reflective layer is provided in one sheet of small wavelength conversion film, but the present invention is not limited thereto. For example, two sheets of the reflective layers 26 are provided in one sheet of the wavelength conversion film, and light from two light sources may be caused to be incident on one sheet of the wavelength conversion film.

Here, according to the research of the present inventors, in the backlight film having the plurality of the wavelength conversion films 24 to be spaced from each other as in the illustrated example, it is advantageous that one sheet of the reflective layers 26 is provided in one sheet of the wavelength conversion films 24 and caused to correspond to one of the light sources 14, in view of reducing the use amount of the wavelength conversion film.

In the backlight film 16 of the embodiment of the present invention, the reflective layer 26 is not limited, and various well-known layers that are used as reflective layers in various well-known optical devices or optical elements can be used.

Accordingly, the reflective layer 26 may be a reflective layer by diffusion reflection such as a diffusion plate, also a reflective layer by interference reflection such as a lamination film, or a reflective layer by specular reflection such as a metal film. These reflective layers 26 may be formed by a well-known method.

As the reflective layer 26, preferably, a reflective layer by diffusion reflection that is obtained by dispersing diffusion particles in the binder that becomes a matrix is exemplified.

As the binder that becomes a matrix, a resin (polymer compound) that is obtained by polymerizing a polymerizable compound is appropriately exemplified.

Examples of the preferable polymerizable compound include a compound having an ethylenically unsaturated bond in at least one of a terminal or a side chain and a compound having an epoxy group or an oxetane group in at least one of a terminal or a side chain, and a compound having an ethylenically unsaturated bond in at least one of a terminal or a side chain is particularly preferable. Specific examples of the compound having an ethylenically unsaturated bond in at least one of a terminal or a side chain include a (meth)acrylate-based compound, an acrylamide-based compound, a styrene-based compound, and a maleic acid anhydride. A (meth)acrylate-based compound is preferable, and an acrylate-based compound is more preferable. The (meth)acrylate-based compound is preferably (meth)acrylate, urethane (meth)acrylate, polyester (meth)acrylate, and epoxy (meth)acrylate. The styrene-based compound is preferably styrene, α-methylstyrene, 4-methylstyrene, divinylbenzene, 4-hydroxystyrene, and 4-carboxystyrene.

It is also preferable to use a compound having a fluorene skeleton as the acrylate-based compound. Specific examples the compound include a compound represented by Formula (2) disclosed in WO2013/047524A1.

A preferable example of the binder include a binder formed by using a graft copolymer having an acrylic polymer as a main chain, having at least one of a urethane polymer having an acryloyl group at the terminal or a urethane oligomer having an acryloyl group at the terminal on a side chain, having a molecular weight of 10,000 to 3,000,000, and having a double bond equivalent of 500 g/mol or more. As the graft copolymer, for example, a commercially available product such as an ultraviolet-curable urethane acrylic polymer (Acrit 8BR series) manufactured by Taisei Fine Chemical Co., Ltd. may be used.

As the diffusion particles, various diffusion particles that are used in the reflective layer or the diffusion plate can be used.

Suitable examples thereof include particles including metal oxides such as aluminum oxide, silicon oxide, titanium oxide, zirconium oxide, and zinc oxide, and other metal compounds such as barium sulfate.

Among these, titanium oxide and zinc oxide are suitably used in terms of dispersibility and light reflectivity, and among which titanium oxide is suitably used.

In the reflective layer 26 obtained by dispersing the diffusion particles in the binder, the content of the diffusion particles may be appropriately set according to types of the diffusion particle, a light reflectance required for the reflective layer 26, or the like.

The reflective layer 26 obtained by dispersing the diffusion particles in the binder can be formed by a coating method. Specifically, the polymerizable compound and the diffusion particles was added to a solvent, the polymerizable compound and the diffusion particles are dissolved and/or dispersed so as to prepare a paint for forming the reflective layer 26, and the wavelength conversion film 24 was coated with the paint, and the paint was dried, so as to form the reflective layer 26. Otherwise, the reflective layer 26 may be formed by applying and drying the paint for forming the reflective layer 26 and then polymerizing (curing, crosslinking) the polymerizable compound, if necessary.

In the paint for forming the reflective layer 26, a viscosity adjuster, a surfactant, or the like may be added if necessary.

The reflective layer 26 may be formed by directly applying the paint to the wavelength conversion film 24 or may be formed by applying a paint on a certain substrate to form the reflective layer 26, peeling off the reflective layer 26 from the substrate, and bonding the reflective layer 26 to the wavelength conversion film 24 with OCA, an optical transparent double-sided tape, or the like.

The application of the paint for forming the reflective layer 26 may be formed by well-known methods such as a method by a dispenser, an ink jet method, or a printing method such as screen printing.

For example, the film thickness distribution of the reflective layer 26 can be adjusted by adjusting the coating condition or the printing condition in a case where paint for forming the reflective layer 26 is applied. For example, in a case where a dispenser or ink jet is used for forming the reflective layer 26, the film thickness distribution of the reflective layer 26 can be adjusted by adjusting the coating conditions such as the coating amount (the number of minute droplets or the like) of the paint, the discharge distance of the paint, and the application pattern of the paint.

The reflective layers 26 may be formed after cutting the wavelength conversion film into the small wavelength conversion films 24, or may be cut into the small wavelength conversion films 24 after forming the reflective layers 26 on a large wavelength conversion film.

As described above, in the planar lighting device 10, the light source 14 is disposed on the bottom plate 12a (bottom surface) of the housing 12 as described above. The light source 14 is a light source of light emitted by the planar lighting device 10.

As the light source 14, various kinds of well-known point light sources may be used, as long as the point light sources emit light having a wavelength that may be converted by the wavelength conversion film 24 (the wavelength conversion layer 30).

Among these, as described above, a light emitting diode (LED) is appropriately exemplified as the light source 14. As described above, preferable examples of the wavelength conversion layer 30 of the wavelength conversion film 24 include a quantum dot layer obtained by dispersing a quantum dot in a matrix of a resin. Therefore, as the light source 14, a blue LED that emits blue light is particularly and suitably used. Among these, particularly, a blue LED having a peak wavelength of 450 nm±50 nm is suitably used.

In the planar lighting device 10, the output of the light source 14 is not particularly limited and may be suitably set according to the brightness (illuminance) of light and the like required in the planar lighting device 10.

The light emitting properties of the light source 14 such as a peak wavelength, a profile of illuminance, and a full width at half maximum are not particularly limited and may be suitably set according to the size of the planar lighting device 10, the distance between the light source 14 and the wavelength conversion film 24, properties of the wavelength conversion layer 30, and the like.

As described above, the light source 14 is disposed such that the optical axis thereof coincides with the center of the reflective layer 26. In other words, the reflective layer 26 and the wavelength conversion film 24 are provided such that the centers thereof coincide with the optical axis of the light source 14.

However, in the planar lighting device 10, the positional relationship between the light source 14 and the reflective layer 26 in the plane direction is not limited to this, and at least the optical axis of the light source 14 may be positioned in the reflective layer 26 in the plane direction.

The distance between the light source 14 and the wavelength conversion film 24 is not particularly limited. Since the LED used as the light source 14 emits the diffused light, the distance between the light source 14 and the wavelength conversion film 24 is preferably set such that all of the light emitted from the light source 14 is applied to the inside of the wavelength conversion film 24. Particularly, the distance between the light source 14 and the wavelength conversion film 24 is preferably set to be a distance in which the beam spot of the light emitted from the light source 14 is inscribed in the wavelength conversion film 24 in the plane direction.

Accordingly, the wavelength conversion film 24 can be effectively used, and the light applied by the light source 14 can be effectively used without waste.

In the planar lighting device 10 using the backlight film 16 of the embodiment of the present invention, the light reflected by the reflective layer 26 is not wasted.

That is, the inner surface of the housing 12 is preferably a light reflecting surface, and thus the light reflected by the reflective layer 26 is reflected by the inner surface of the housing 12 and is incident on the wavelength conversion film 24. As described above, since a diffusion plate or a prism sheet is generally disposed on the planar lighting device 10, even in a case where the light reflected on the inner surface of the housing 12 is incident on a region other than the wavelength conversion film 24 of the backlight film 16 (the support 20), the light is retroreflected by a prism sheet or the like, is incident on the housing 12 again, and is reflected on the inner surface of the housing 12.

Therefore, in the planar lighting device 10 using the backlight film 16 of the embodiment of the present invention, the light emitted from the light source 14 can be very effectively used without waste.

As the preferable aspect, the backlight film 16 illustrated in FIGS. 1 to 3 has a configuration in which the plurality of the small wavelength conversion films 24 are provided to be spaced from each other on the support 20, and one of the reflective layers 26 is provided on each of the wavelength conversion films 24, but the present invention is not limited thereto, and various configurations can be used.

For example, like a planar lighting device 38 conceptually illustrated in FIG. 4, the backlight film of the present invention may have a configuration in which one of the reflective layers 26 is provided in a large wavelength conversion film 24L that closes the entire surface of the open surface of the housing 12. In this case, for example, the planar lighting device 38 may have one of the light sources 14 corresponding to one of the reflective layers 26, or the plurality of the light sources 14 may be provided corresponding to one of the reflective layers 26.

Otherwise, like a planar lighting device 40 conceptually illustrated in FIG. 5, the backlight film of the present invention may have a configuration in which the plurality (three in the illustrated example) of the reflective layers 26 are provided in a large wavelength conversion film 24L that closes the entire surface of the open surface of the housing 12. In this case, for example, the planar lighting device 40 has one light source 14 with respect to one sheet of the reflective layers 26.

That is, as illustrated in FIGS. 4 and 5, the backlight film of the present invention is formed with one sheet of the wavelength conversion films 24L In other words, the backlight film of the present invention may be formed only with the wavelength conversion film and the reflective layers without a support. The backlight film of the present invention including one sheet of the wavelength conversion films 24 provided with the reflective layers 26 may be supported by the support 20 as illustrated in FIG. 1.

As illustrated in FIGS. 1 to 5, the backlight film of the embodiment of the present invention can be used not only for a direct-type planar lighting device but also for a so-called edge light-type planar lighting device using a light guide plate.

In this case, the backlight film of the embodiment of the present invention may be disposed between the light source and the light incidence surface of the light guide plate such that the light source and the reflective layer correspond to each other.

In the above, the backlight film of the embodiment of the present invention is been described, but the present invention is not limited to the above embodiments, and it is obvious that various improvements and modifications may be performed without departing from the gist of the present invention.

EXAMPLES

Hereinafter, the present invention is specifically described, reference to the specific examples. The present invention is not limited to the examples described below, and a material, an amount used, a treatment detail, a treatment order, and the like provided in the following examples can be suitably changed without departing from the gist of the present invention.

Example 1

\<Manufacturing of Barrier Film 32\>

As the supporting substrate, a PET film (COSMOSHINE A4300 manufactured by Toyobo Co., Ltd., thickness 50 μm) was prepared. This PET film had easy adhesion layers on both sides.

A barrier layer was formed on one side of the supporting substrate by the following procedure.

Trimethylolpropane triacrylate (manufactured by Daicel-Cytec Co., Ltd.) and a photopolymerization initiator (ESACURE KTO46 manufactured by Lamberti S.p.A.) were prepared and weighed so as to have the mass ratio of 95:5, and these were dissolved in methyl ethyl ketone, so as to obtain a coating solution having a concentration of solid contents of 15%.

This coating solution was applied to a supporting substrate by roller-to-roller by using a die coater and was caused to pass through a drying zone at 50° C. The residence time in the drying zone was 3 minutes. Thereafter, the dried paint was cured by irradiating the paint with ultraviolet rays in a nitrogen atmosphere (integrating accumulate irradiation amount: about 600 mJ/cm$^2$) and was cured so as to form an organic layer, and the organic layer was wound up. The thickness of the organic layer formed on the supporting substrate was 1 μm.

The following description, roller-to-roller is also referred to as "RtoR".

Subsequently, a silicon nitride layer was formed as an inorganic layer on the surface of the organic layer by using a CVD device by RtoR.

Silane gas (flow rate: 160 sccm), ammonia gas (flow rate: 370 sccm), hydrogen gas (flow rate: 590 sccm), and nitrogen gas (flow rate: 240 sccm) were used as raw material gases. As the power source, a high frequency power source with a frequency of 13.56 MHz was used. Film formation pressure was set to 40 Pa, and the achieved film thickness was set to 50 nm.

In this manner, as the barrier film 32, the lamination type barrier film (organic-inorganic lamination type gas barrier film) having an organic layer on the front surface of a supporting substrate including a PET film and having an inorganic layer on the organic layer was manufactured. Two sheets of the barrier films 32 were manufactured.

\<Manufacturing Wavelength Conversion Layer 30 (Quantum Dot Layer) and Wavelength Conversion Film 24\>

The following quantum dot containing polymerizable composition was prepared and filtrated with a polypropylene filter having a pore size of 0.2 μm, and was dried under reduced pressure for 30 minutes.

In the following, CZ520-100 manufactured by NN-LABS, LLC. was used as the toluene dispersion liquid of the quantum dot 1 having the light emission maximum wavelength of 535 nm. CZ620-100 manufactured by NN-LABS, LLC. was used as the toluene dispersion liquid of the quantum dot 2 having the light emission maximum wavelength of 630 nm.

Both of these were quantum dots using CdSe as a core, ZnS as a shell, and octadecylamine as a ligand, respectively, and were dispersed in toluene at a concentration of 3 mass %.

\<\<Quantum Dot Containing Polymerizable Composition\>\>

| | |
|---|---|
| Toluene dispersion liquid of quantum dot 1 (light emission maximum: 535 nm) | 10 parts by mass |
| Toluene dispersion liquid of quantum dot 2 (light emission maximum: 630 nm) | 1 part by mass |
| Lauryl methacrylate | 40 parts by mass |
| Difunctional methacrylate 4G (manufactured by Shin-Nakamura Chemical Co., Ltd.) | 20 parts by mass |
| Trifunctionalacrylate TMPTA (manufactured by Daicel Corporation) | 20 parts by mass |
| Urethane acrylate UA-160TM (manufactured by Shin-Nakamura Chemical Co., Ltd.) | 10 parts by mass |
| Silane coupling agent KBM-5103 (manufactured by Shin-Etsu Chemical Co., Ltd.) | 10 parts by mass |
| Photopolymerization initiator IRGACURE 819, (manufactured by BASF SE) | 1 parts by mass |

One sheet of the barrier film 32 manufactured as described above was continuously transported by RtoR at 1 m/min and the tension of 60 N/m in the longitudinal direction and was coated with the quantum dot containing polymerizable composition prepared on the surface of the inorganic layer by a die coater, so as to form a coating film having a thickness of 50 μm.

Subsequently, the barrier film 32 on which the coating film was formed was wrapped around a backup roller, another barrier film 32 was laminated on the coating film in a direction in which the inorganic layer was in contact with the coating film, and the coating film was caused to pass through the heating zone at 100° C. while continuous transportation was performed in a state in which the coating film was sandwiched between two barrier films 32. The residence time in the drying zone was 3 minutes.

Thereafter, the coating film was cured by being irradiated with ultraviolet rays by using an air cooling metal halide lamp (manufactured by Eye Graphics Co., Ltd.) of 160 W/cm, so as to manufacture a long wavelength conversion film in which the wavelength conversion layer 30 (quantum dot layer) was sandwiched between two sheets of the barrier films 32. The irradiation amount with ultraviolet rays was 2,000 mJ/cm$^2$.

\<Preparing of Paint for Forming the Reflective Layer 26\>

0.31 g of polymethyl methacrylate (DIANAL BR-88 manufactured by Mitsubishi Rayon Co., Ltd., weight-average molecular weight=1,300,000 g/mol) was introduced to a solvent of 4.18 g of methyl ethyl ketone and stirred for 12 hours so as to be dissolved.

2.12 g of an acrylate-based compound (8BR500 (urethane (meth)acrylate) manufactured by Taisei Fine Chemical Co., Ltd.), 0.4 g of titanium oxide (CR-97 manufactured by Ishihara Kogyo Co., Ltd.) having a particle diameter of 0.25 μm, 2.0 g of methyl ethyl ketone, and 1.0 g of propylene glycol monomethyl ether acetate were introduced to a solution in which polymethyl methacrylate was dissolved, were stirred for one hour so as to prepare the paint for forming the reflective layer 26.

\<Forming of the Wavelength Conversion Film 24 and the Reflective Layer 26\>

The wavelength conversion film 24 of 25×25 mm was manufactured by cutting the produced long wavelength conversion film with a Thomson punching blade.

One surface (supporting substrate of one of the barrier films 32) of the manufactured wavelength conversion films 24 was coated with the prepared paint for forming the reflective layer 26 by using a dispenser (manufactured by Musashi Engineering, Inc., AeroJet). Subsequently, the paint was dried at 70° C. for 10 minutes, the reflective layer 26 was formed on one surface of each wavelength conversion film 24, so as to manufacture the backlight film.

The reflective layer 26 was formed in a circular shape having a diameter of 8.6 mm such that the center thereof coincided with the center of the wavelength conversion film 24. The thickness of the reflective layer 26 was 15 µm.

The thickness of the reflective layer 26 of the wavelength conversion film 24 was measured by a contact type film thickness meter (TOF-5R, manufactured by Yamabun Electronics Co., Ltd.), so as to measure the film thickness distribution as described above.

As a result, the film thickness distribution of the reflective layer 26 was ±4.8%.

Example 2

In the formation of the reflective layer 26, a backlight film was manufactured in the same manner as in Example 1 except that the application condition by the dispenser was changed.

In the same manner as in Example 1, the film thickness distribution of the reflective layer 26 of each of the wavelength conversion films 24 was measured. As a result, the film thickness distribution of the reflective layer 26 was ±2.3%.

Comparative Example 1

The backlight film was manufactured in the same manner as in Example 1, except that the reflective layer 26 was not used.

Comparative Example 2

In the formation of the reflective layer 26, a backlight film was manufactured in the same manner as in Example 1 except that the application condition by the dispenser was changed.

In the same manner as in Example 1, the film thickness distribution of the reflective layer 26 of each of the wavelength conversion films 24 was measured. As a result, the film thickness distribution of the reflective layer 26 was ±5.3%.

With respect to the backlight film manufactured in this manner, the durability and the brightness distribution were measured in the following manner.

[Measurement of Durability]

<Manufacturing of Planar Lighting Device>

As the housing 12, a rectangular housing having one opening surface of 100×100 mm and having a mirror-finished inner surface was prepared.

Meanwhile, the manufactured backlight film was bonded to a flat plate of 100×100 mm. In this flat plate, one surface was a mirror surface, and the backlight film was bonded to the mirror surface side. The flat plate is transparent only at the bonding position of the backlight film. The bonding of the backlight film was performed by using OCA (manufactured by The 3M Company, 8172CL).

In a case where an opening surface was closed with a flat plate to which the backlight film was bonded, the light source 14 was fixed to the bottom surface of the housing 12 such that the center of the reflective layer 26 coincided with the optical axes thereof. As the light source 14, a blue LED (manufactured by Nichia Corporation, NSPB346KS, a peak wavelength of 450 nm, full width at half maximum of 55 nm) was used.

Subsequently, the open surface of the housing 12 was closed with a flat plate to which the backlight film was bonded, so as to manufacture a planar lighting device. The housing 12 was closed such that the backlight film faced the inner surface side.

The distance between the light source 14 and the wavelength conversion film 24 was set such that the diameter of the spread of the blue light emitted from the light source 14 on the surface of the wavelength conversion film 24 was 20 mm.

The light source of the planar lighting device manufactured in this manner was turned on, and the brightness was measured by a display color analyzer (CA-210 manufactured by Konica Minolta, Inc.) so as to obtain initial brightness L0.

The planar lighting device 10 was turned on for 1,000 hours without change, and the brightness was measured in the same manner, so as to obtain the post-test brightness L1.

From the initial brightness L0 and the post-test brightness L1, the durability [%] was evaluated according to the following equation.

$$\text{Durability}[\%]=(L1/L0)\times 100$$

As the results thereof,
durability of Example 1 was 86%,
durability of Example 2 was 86%,
durability of Comparative Example 1 was 8%, and
durability of Comparative Example 2 was 86%.

[Measuring of Color Unevenness]

A commercially available tablet terminal (manufactured by Amazon.com, Inc., Kindle Fire IIDX 7") was disassembled and the backlight unit was taken out.

The manufactured backlight film was placed on the light guide plate of the backlight unit which was taken out, and two prism sheets in which directions of surface concavo-convex patterns were orthogonal to each other were overlapped.

The y value at "International Commission on Illumination (CIE) 1931 chromaticity coordinates xy" of light emitted from the blue light source of the backlight unit and transmitted by the backlight film and the two prism sheets was measured. The measuring is performed with a brightness meter (SR3 manufactured by Topcon Positioning Systems Inc.) set at a position 740 mm in the direction perpendicular to the surface of the light guide plate. Measurement was performed at intervals of 1 mm along the diameter direction of the reflective layer.

A value obtained by subtracting the minimum value from the maximum value of the measured y values was set as $\Delta y$, so as to evaluate the color unevenness by the following evaluation standards.

Evaluation Standard
$\Delta y<0.004$: Excellent
$0.004 \leq \Delta y<0.012$: Satisfactory
$0.012 \leq \Delta y$: Unsatisfactory As the results thereof,
the brightness distribution of Example 1 was satisfactory,
the brightness distribution of Example 2 was excellent,
the brightness distribution of Comparative Example 1 was unsatisfactory, and
the brightness distribution of Comparative Example 2 was unsatisfactory.

As described above, even in a case where the backlight film of the embodiment of the present invention in which the wavelength conversion film 24 had the reflective layer 26, and further the film thickness distribution of the reflective layer 26 was ±5% or less is disposed to be near to the blue LED, the backlight film has excellent durability and less color unevenness of the emitted light.

In contrast, with respect to the backlight film of Comparative Example 1 not having the reflective layer 26, it was considered that the wavelength conversion layer 30 was deteriorated by light and heat of the near blue LED, such that brightness L1 after the durability test greatly decreased with respect to initial brightness L0. With respect to the backlight film of Comparative Example 1 not having the reflective layer 26, since the wavelength conversion layer 30 was deteriorated by light and heat, color unevenness of the emitted light was great.

In the backlight film of Comparative Example 2 in which the reflective layer 26 was provided but the film thickness distribution of the reflective layer 26 was greater than ±5%, great color unevenness occurred in the emitted light.

According to the above results, the effect of the present invention is clear.

It may be suitably used as illumination light sources of various devices such as an LCD backlight.

EXPLANATION OF REFERENCES

10, 38, 40: lighting device
12: housing
12*a*: bottom plate
14: light source
16: backlight film
20: support
24, 24L: wavelength conversion film
26: reflective layer
30: wavelength conversion layer
32: (gas) barrier film

What is claimed is:

1. A backlight film comprising:
    a wavelength conversion film having a wavelength conversion layer and gas barrier films that sandwich the wavelength conversion layer; and
    at least one reflective layer provided on one main surface of the wavelength conversion film,
    wherein a film thickness distribution of the reflective layer is ±5% or less,
    wherein the reflective layer is provided on the one main surface on a light incident side of the wavelength conversion film, on which light is directly incident from a light source, and
    wherein an area of one main surface on the light incident side of the reflective layer is 1% to 30% with respect to an area of the one main surface on the light incident side of the wavelength conversion film.

2. The backlight film according to claim 1, further comprising:
    a support that supports the wavelength conversion film,
    wherein a plurality of the wavelength conversion films are spaced from each other in a plane direction of the support, and at least one reflective layer is provided for each of the wavelength conversion films.

3. The backlight film according to claim 1,
    wherein a thickness of the reflective layer is 10 μm or more.

4. The backlight film according to claim 2,
    wherein a size of the wavelength conversion film is 1,000 mm$^2$ or less.

5. The backlight film according to claim 1,
    wherein the reflective layer reflects light in a wavelength range of 420 to 490 nm by 50 to 90%.

6. A planar lighting device comprising:
    a backlight film; and
    at least one light source to emit light into the backlight film,
    wherein the backlight film has a wavelength conversion film having a wavelength conversion layer and gas barrier films that sandwich the wavelength conversion layer; and at least one reflective layer provided on one main surface of the wavelength conversion film, and
    wherein in the backlight film, a film thickness distribution of the reflective layer is ±5% or less, the reflective layer is obtained by dispersing diffusion particles in a binder and is provided at a fixed location and a fixed reflectance on the one main surface on the light source side of the wavelength conversion film, on which light is directly incident from the light source, an area of one main surface on the light source side of the reflective layer is 1% to 30% with respect to an area of the one main surface on the light source side of the wavelength conversion film, and the light source is disposed such that an optical axis coincides with a center of the reflective layer in a plane direction.

7. The planar lighting device according to claim 6, wherein the backlight film further comprises:
    a support that supports the wavelength conversion film,
    wherein a plurality of the wavelength conversion films are spaced from each other in a plane direction of the support, and at least one reflective layer is provided for each of the wavelength conversion films.

* * * * *